US009077336B2

(12) United States Patent
Imada

(10) Patent No.: US 9,077,336 B2
(45) Date of Patent: Jul. 7, 2015

(54) TRANSISTOR CONTROL CIRCUIT AND POWER SUPPLY DEVICE

(71) Applicant: FUJITSU LIMITED, Kawasaki-shi, Kanagawa (JP)

(72) Inventor: Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/966,693

(22) Filed: Aug. 14, 2013

(65) Prior Publication Data

US 2014/0111268 A1    Apr. 24, 2014

(30) Foreign Application Priority Data

Oct. 22, 2012 (JP) ................. 2012-232757

(51) Int. Cl.
*H03K 17/06* (2006.01)
*H03K 17/567* (2006.01)
*H02M 1/00* (2007.01)

(52) U.S. Cl.
CPC .......... *H03K 17/063* (2013.01); *Y02B 70/1483* (2013.01); *H03K 17/567* (2013.01); *H02M 2001/0054* (2013.01); *Y02B 70/1491* (2013.01)

(58) Field of Classification Search
USPC ................. 327/148, 157, 365–508, 534–537; 363/59, 60
See application file for complete search history.

(56) References Cited

U.S. PATENT DOCUMENTS

| 5,831,472 | A | * | 11/1998 | Wang et al. .................... 327/543 |
| 5,936,455 | A | * | 8/1999 | Kobayashi et al. ........... 327/437 |
| 6,100,571 | A | * | 8/2000 | Mizuta et al. ................. 257/488 |
| 6,201,375 | B1 | * | 3/2001 | Larson et al. ................. 323/277 |
| 6,630,858 | B1 | * | 10/2003 | Takabayashi ................. 327/538 |
| 6,794,916 | B1 | * | 9/2004 | Varma .......................... 327/218 |
| 7,042,281 | B2 | * | 5/2006 | Baglin et al. .................. 327/541 |
| 7,279,961 | B2 | * | 10/2007 | Chan et al. .................... 327/540 |
| 7,365,595 | B2 | * | 4/2008 | Lee ............................... 327/538 |
| 7,420,357 | B2 | * | 9/2008 | Bayer ........................... 323/283 |
| 8,294,442 | B2 | * | 10/2012 | Zhu ............................... 323/281 |
| 2004/0075485 | A1 | * | 4/2004 | Chun ............................ 327/427 |
| 2005/0243623 | A1 | * | 11/2005 | Baglin et al. .................. 365/205 |
| 2006/0102929 | A1 | * | 5/2006 | Okamoto et al. ............. 257/189 |
| 2008/0150621 | A1 | * | 6/2008 | Lesso et al. ................... 327/536 |
| 2009/0016084 | A1 | * | 1/2009 | Trattler ........................... 363/60 |
| 2009/0052216 | A1 | * | 2/2009 | Iwabuchi et al. ............. 363/132 |

FOREIGN PATENT DOCUMENTS

JP     2006-114795 A1    4/2006

* cited by examiner

*Primary Examiner* — Brandon S Cole
(74) *Attorney, Agent, or Firm* — Kratz, Quintos & Hanson, LLP

(57) ABSTRACT

A transistor control circuit includes: an electrode control circuit configured to apply a positive potential to a control electrode in a transistor that includes the control electrode between a gate and a drain.

5 Claims, 6 Drawing Sheets

TRANSISTOR CONTROL CIRCUIT AND POWER SUPPLY DEVICE

CROSS-REFERENCE TO RELATED APPLICATION

This application is based upon and claims the benefit of priority of the prior Japanese Patent Application No. 2012-232757, filed on Oct. 22, 2012, the entire contents of which are incorporated herein by reference.

FIELD

The embodiments discussed herein are related to a high-electron-mobility transistor control circuit, and to a power supply device.

BACKGROUND

Recently, there has been active development of electronic devices (compound semiconductor devices) in which a gallium nitride (GaN) layer and an AlGaN layer are successively formed on a substrate made up a material such as sapphire, SiC, GaN, or Si, with the GaN layer being used as an electron transit layer.

The bandgap of GaN is 3.4 eV, which is large compared to the 1.1 eV for Si and the 1.4 eV for GaAs. For this reason, high-voltage operation is anticipated for such compound semiconductor devices.

One such compound semiconductor device is a GaN-based high-electron-mobility transistor (HEMT). Hereinafter, such a GaN-based high-electron-mobility transistor will be designated a GaN-HEMT. A HEMT is a field-effect transistor incorporating a high-mobility two-dimensional electron gas (2DEG) induced by a semiconductor heterojunction as a channel.

Using a GaN-HEMT as a switch in an inverter for a power supply simultaneously enables both a reduction in the on-resistance and an improvement in the withstand voltage. Furthermore, reducing the power consumption during standby compared to a Si-based transistor is possible, and improving the operating frequency is also possible.

For this reason, switching loss may be reduced, making it possible to reduce the power consumption of the inverter. In addition, for transistors with equivalent performance, miniaturization compared to a Si-based transistor is possible.

If a GaN-HEMT is operated at a high frequency and high voltage, there occurs a current collapse phenomenon in which the drain current decreases. One conceivable cause of the current collapse phenomenon is that free electrons become trapped in electron trap levels near the drain electrode side of the gate electrode. If electrons become trapped in surface trap levels, a depletion layer is formed in the 2DEG layer, thereby increasing the on-resistance between the source and drain, which may lead to reduced output of the GaN-HEMT. As a countermeasure against the current collapse phenomenon, there exists a technique that provides a field plate electrode having the same potential as the source electrode between the gate and drain, in order to moderate electric field amplification near the gate electrode.

However, when attempting to operate a GaN-HEMT at even higher frequencies and higher voltages, there is a problem in that simply providing a field plate is insufficient to lower the on-resistance between the source and drain.

The following is reference document:
[Document 1] Japanese Laid-Open Patent Publication No. 2006-114795.

SUMMARY

According to an aspect of the invention, a transistor control circuit includes: an electrode control circuit configured to apply a positive potential to a control electrode in a transistor that includes the control electrode between a gate and a drain.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

If a GaN-HEMT is operated at a high frequency and high voltage, there occurs a current collapse phenomenon in which the drain current decreases. One conceivable cause of the current collapse phenomenon is that free electrons become trapped in electron trap levels near the drain electrode side of the gate electrode. If electrons become trapped in surface trap levels, a depletion layer is formed in the 2DEG layer, thereby increasing the resistance between the source and drain, which may lead to reduced output of the GaN-HEMT. As a countermeasure against the current collapse phenomenon, there exists a GaN-HEMT that includes a control electrode made of a metal plate (hereinafter designated a field plate) between the gate and drain, in order to moderate electric field amplification near the gate electrode.

Figure 1:
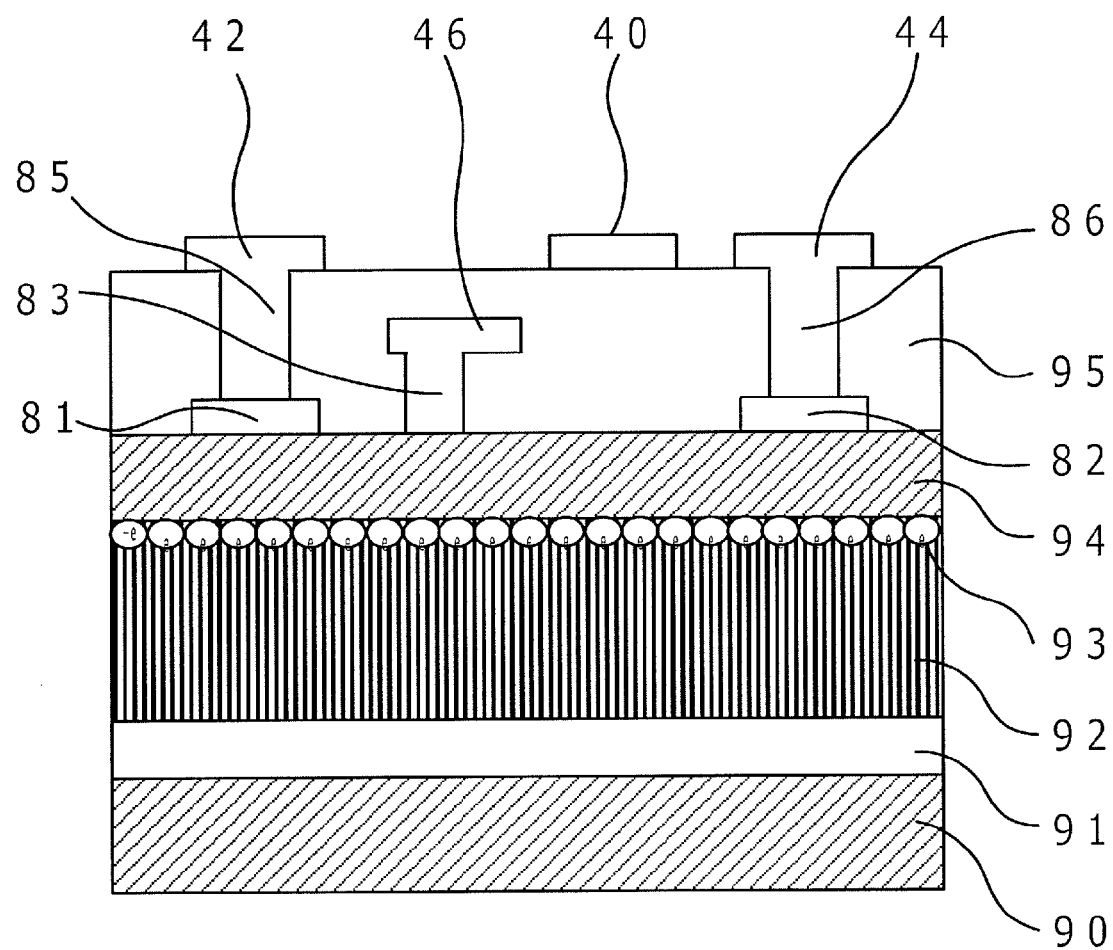
FIG. 1 is a diagram illustrating the structure of a GaN-HEMT that includes a field plate.

FIG. 1 is a cross-section diagram illustrating the structure of a GaN-HEMT 30 that includes a field plate 40. An AlN layer 91, a non-doped i-GaN layer 92, and an n-type n-AlGaN layer 94 are successively formed on top of a SiC substrate 90. Additionally, a source electrode 81, a drain electrode 82, and a gate electrode 83 are formed on top of the n-AlGaN layer 94. In the GaN-HEMT 30, a two-dimensional electron gas (2DEG) 93 formed at the interface between the n-AlGaN layer 94 and the i-GaN layer 92 is incorporated as a carrier. Note that the AlN layer 91 functions as a buffer layer.

Additionally, an inter-layer insulating film 95 made of an insulating material such as polyimide is formed on top of the t-type n-AlGaN layer 94, the source electrode 81, the drain electrode 82, and the gate electrode 83.

Inside the inter-layer insulating film 95 is formed a gate field plate 46 extending in the horizontal direction that is electrically connected to the gate electrode 83.

A source electrode pad 42 is formed on top of the inter-layer insulating film 95 at the position of the source electrode 81, and is electrically connected to the source electrode 81 via a contact plug 85 formed inside the inter-layer insulating film 95.

Also, a drain electrode pad 44 is formed on top of the inter-layer insulating film 95 at the position of the drain electrode 82, and is electrically connected to the drain electrode 82 via a contact plug 86 formed inside the inter-layer insulating film 95.

In addition, a field plate 40 made of a metal plate is formed on top of the inter-layer insulating film 95 between the gate field plate 46 and the drain electrode pad 44.

If the field plate 40 is viewed as a second gate with a threshold value farther in the minus direction than the gate electrode 83, then the GaN-HEMT 30 with a field plate may be viewed as being two devices.

Figure 2:
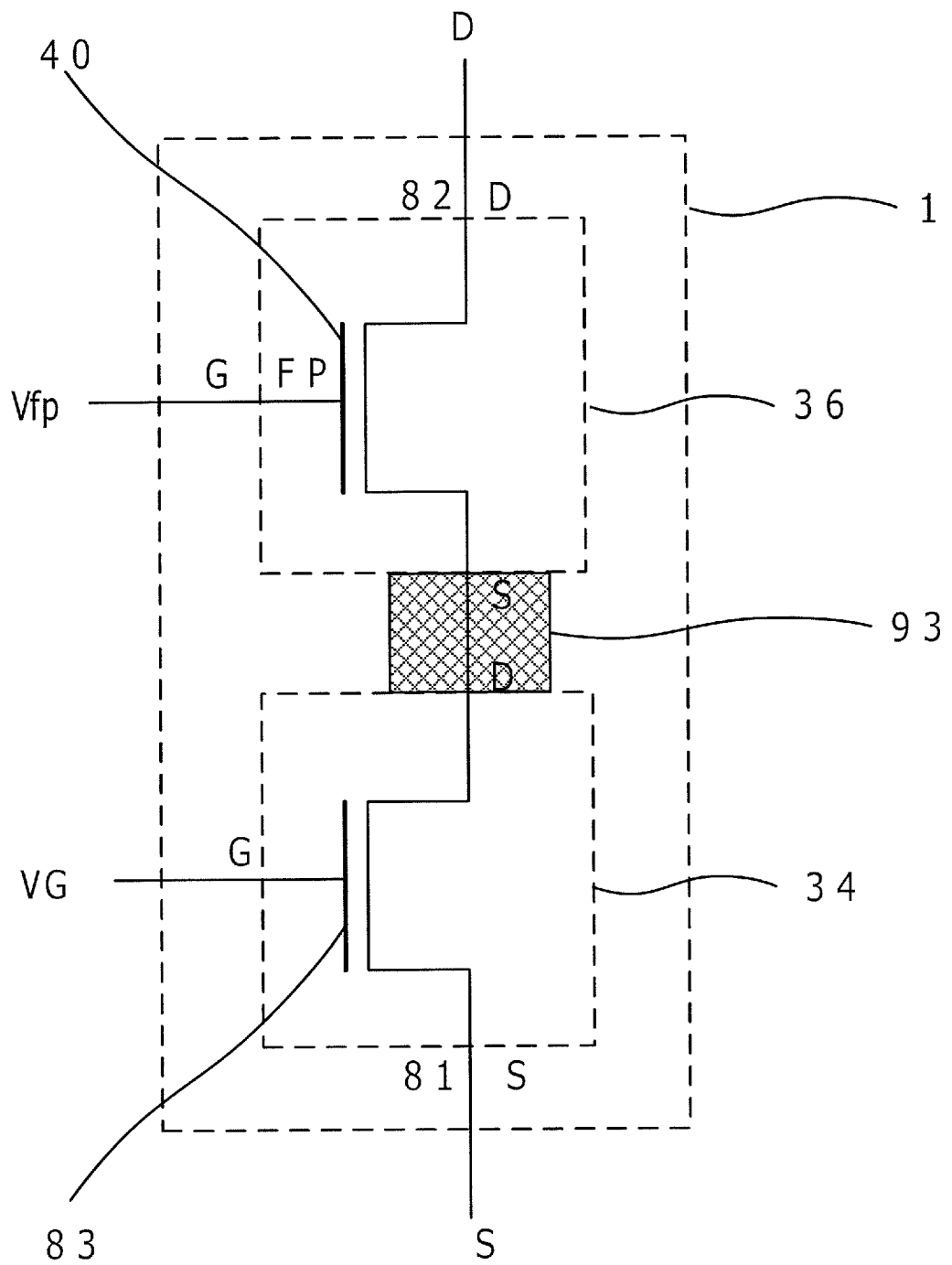
FIG. 2 is an equivalent circuit diagram of a GaN-HEMT that includes a field plate.

FIG. 2 illustrates an equivalent circuit diagram of the GaN-HEMT 30 with a field plate. A first device 34 takes the source electrode 81 of the GaN-HEMT 30 as the source, the gate electrode 83 of the GaN-HEMT 30 as the gate, and the end of the two-dimensional electron gas 93 under the drain end of the GaN-HEMT 30 as the drain.

A second device 36 takes the other end of the two-dimensional electron gas 93 under the drain end of the GaN-HEMT 30 as the source, the field plate 40 of the GaN-HEMT 30 as the gate, and the drain electrode 82 of the GaN-HEMT 30 as the drain.

Next, operation when the GaN-HEMT 30 with a field plate switches off will be described. The threshold value of the gate of the first device 34 is taken to be −5 V, for example, while the threshold value of the gate of the second device 36 is taken to be −10 V, for example.

If the gate voltage of the first device 34 is set to −5 V or less and the first device 34 is switched off, the gate resistance of the first device 34 will increase, and thus the drain voltage of the first device 34 will rise in equilibrium with the resistance value versus the second device 36, which is still on. As the drain voltage of the first device 34 rises, the source voltage of the second device 36 will rise, and the second device 36 will switch off at the point where the source voltage of the second device 36 reaches 10 V.

Typically, the field plate 40 is set to the same potential as the source electrode 81 such that the electric field is not overly exerted near the drain electrode 82 side of the gate electrode 83, and thereby works to moderate electric field amplification and not obstruct free electron movement.

The inventor measured change in dynamic on-resistance in the case of applying a positive voltage to the field plate 40 while the GaN-HEMT 30 is in a conducting state.

Figure 3:
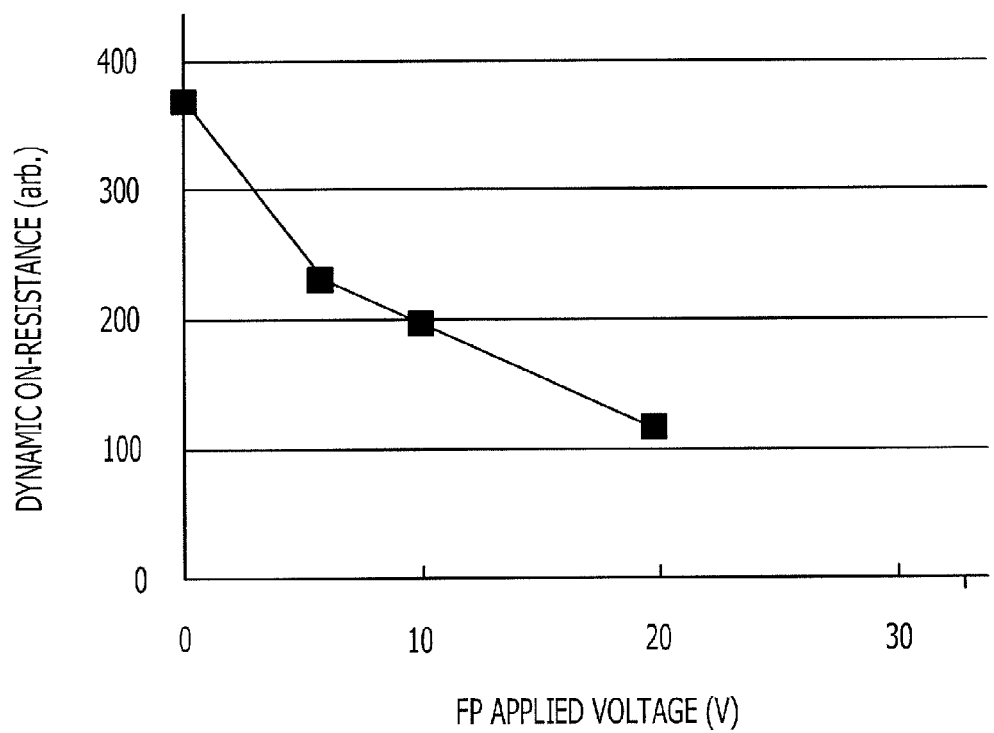
FIG. 3 is a diagram illustrating the relationship between the voltage applied to a field plate and dynamic on-resistance.

FIG. 3 illustrates dynamic on-resistance values for the state of not applying a voltage to the field plate 40 of the GaN-HEMT 30, the state of applying 6 V, the state of applying 10 V, and the state of applying 20 V. FIG. 3 demonstrates that the on-resistance value falls as the voltage applied to the field plate 40 rises.

The inventor infers that the decrease in the on-resistance value when applying a positive voltage to the field plate 40 of the GaN-HEMT 30 is caused by the following.

As described earlier, the field plate 40 moderates electric field amplification near the gate electrode 83, and has the effect of making free electrons less likely to become trapped in electron trap levels near the drain electrode 82 side of the gate electrode 83. However, if the GaN-HEMT 30 is operated at an even higher frequency and higher voltage, keeping the field plate 40 at the same potential as the source electrode 81 results in free electrons becoming trapped in electron trap levels near the drain electrode 82 side of the gate electrode 83, which decreases the concentration of the two-dimensional electron gas 93, and thereby increases the resistance between the source and drain.

Consequently, applying a positive voltage to the field plate 40 is thought to have the effect of increasing the two-dimensional electron gas 93 that has been decreased due to trapped electrons, thereby improving the flow of the two-dimensional electron gas 93.

In addition, applying a positive voltage to the field plate 40 is thought to have the effect of drawing the two-dimensional electron gas 93 concentrated near the gate electrode 83 towards the drain electrode 82, thereby restoring the original concentration of the two-dimensional electron gas 93 and improving the flow of the two-dimensional electron gas 93.

Thus, the inventor devised the following exemplary embodiment as a circuit for lowering the on-resistance of the GaN-HEMT 30.

Hereinafter, a preferred exemplary embodiment according to the technology of the present disclosure will be described in detail and with reference to the drawings.

Figure 4:
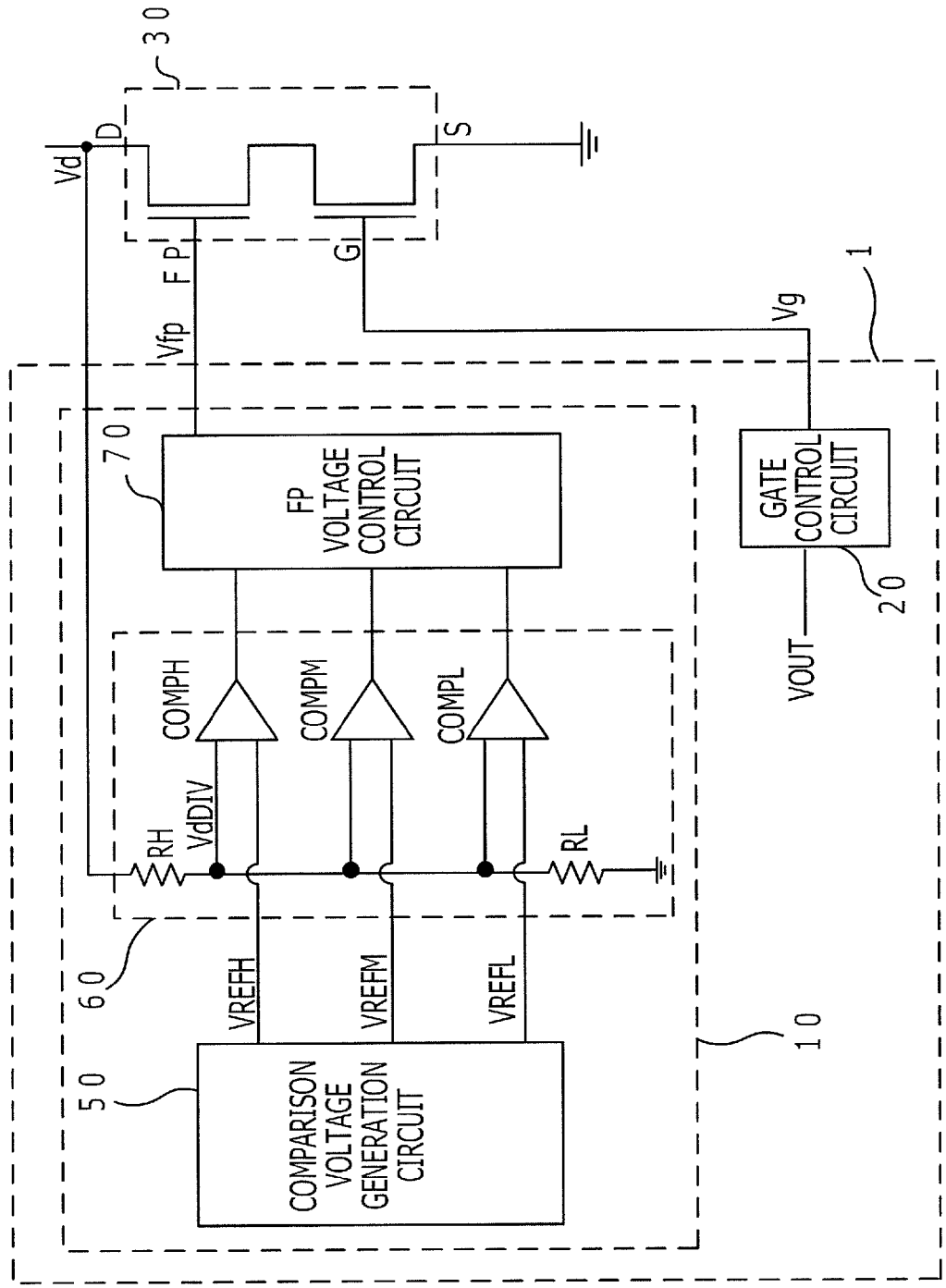
FIG. 4 is a circuit diagram of a GaN-HEMT control circuit according to an embodiment.

FIG. 4 is a diagram illustrating a transistor control circuit 1 according to an embodiment applying the technology of the disclosure.

The control circuit 1 of a GaN-HEMT 30 having a field plate 40 according to the present embodiment includes a field plate control circuit 10 that controls the field plate 40, and a gate control circuit 20 that controls the gate electrode 83.

The field plate control circuit 10 includes a comparison voltage generation circuit 50, a drain voltage determination circuit 60, and an FP voltage control circuit 70.

The comparison voltage generation circuit 50 generates three comparison voltages VREFH, VREFM, and VREFL, for example, in order to determine that value of a divided voltage value VdDIV obtained by dividing a drain voltage Vd in the drain voltage determination circuit 60. The drain voltage determination circuit 60 includes three comparators COMPH, COMPM, and COMPL, for example, in order to compare the differences between the divided voltage value VdDIV and the comparison voltages VREFH, VREFM, and VREFL. In the case where the GaN-HEMT 30 is used as a switch in a circuit that operates at a comparatively high voltage, such as the case of being used as a switch in an inverter for a server power supply, for example, the drain voltage Vd may even become 400 V. Thus, direct comparison against the drain voltage Vd may be impractical with the comparators COMPH, COMPM, and COMPL inside the drain voltage determination circuit 60. Consequently, the comparators COMPH, COMPM, and COMPL compare a divided voltage value VdDIV, which is obtained by dividing the drain voltage Vd into 1/100 with voltage division resistors RH and RL, for example, against the three comparison voltages VREFH, VREFM, and VREFL.

The FP voltage control circuit 70 generates a voltage to impart to the field plate 40 on the basis of the comparison results from the comparators COMPH, COMPM, and COMPL.

The gate control circuit 20 controls the gate of the GaN-HEMT 30 to switch the GaN-HEMT 30 on and off. In the case of providing the GaN-HEMT 30 in a power factor corrector (PFC) in order to improve the power factor of the power supply in a power supply device, the gate control circuit 20 controls the pulse width of a pulse width modulation (PWM) signal that switches the GaN-HEMT 30 on and off according to changes in an output voltage VOUT.

Figure 5A:
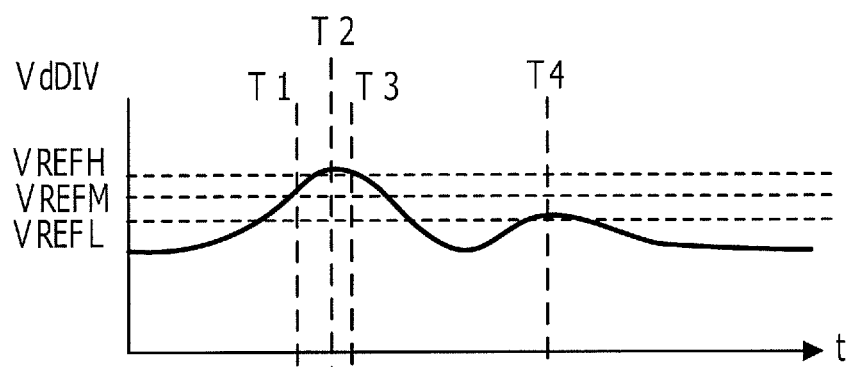
FIGS. 5A and 5B are diagrams for explaining operation of a GaN-HEMT control circuit according to an embodiment.
Figure 5B:
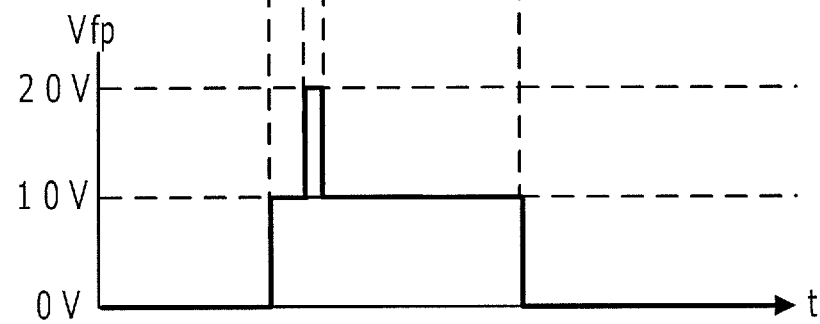

Next, operation of the field plate control circuit 10 will be described using FIGS. 5A and 5B. FIG. 5A illustrates change in the divided voltage value VdDIV obtained by dividing the drain voltage Vd, while FIG. 5B illustrates change in the voltage value applied to the field plate 40. First, the state in which a voltage is not applied to the field plate 40 is indicated.

However, if the drain voltage Vd rises as the on-resistance rises while the GaN-HEMT 30 is in operation, the divided voltage value VdDIV also rises. The drain voltage determination circuit 60 notifies the FP voltage control circuit 70 upon detecting that the divided voltage value VdDIV has exceeded the comparison voltage VREFM. The FP voltage control circuit 70 applies 10 V, for example, to the field plate 40 at time T1.

If the on-resistance does not fall even after applying 10 V to the field plate 40 and the drain voltage Vd rises further, the divided voltage value VdDIV likewise rises further. The drain voltage determination circuit 60 detects that the divided voltage value VdDIV has exceeded the comparison voltage VREFH, and notifies the FP voltage control circuit 70. The FP voltage control circuit 70 applies 20 V, for example, to the field plate 40 at time T2.

If the on-resistance falls and the drain voltage Vd lowers due to applying 20 V to the field plate 40, the divided voltage value VdDIV likewise lowers. The drain voltage determination circuit 60 detects that the divided voltage value VdDIV has fallen below the comparison voltage VREFH, and notifies the FP voltage control circuit 70. The FP voltage control circuit 70 lowers the voltage applied to the field plate 40 from 20 V to 10 V, for example, at time T3.

Since the voltage applied to the field plate 40 drops suddenly, the on-resistance also drops suddenly, and the drain voltage Vd likewise temporarily drops suddenly. The drain voltage Vd rises again, but the drain voltage determination circuit 60 detects that the divided voltage value VdDIV has exceeded the comparison voltage VREFL, and notifies the FP voltage control circuit 70. The FP voltage control circuit 70 stabilizes the drain voltage Vd by switching off the application of voltage to the field plate at time T4.

In this way, varying the voltage applied to the field plate 40 according to change in the drain voltage Vd of the GaN-HEMT 30 enables blocking of rises in on-resistance and stabilization of the output from the GaN-HEMT 30.

Figure 6:
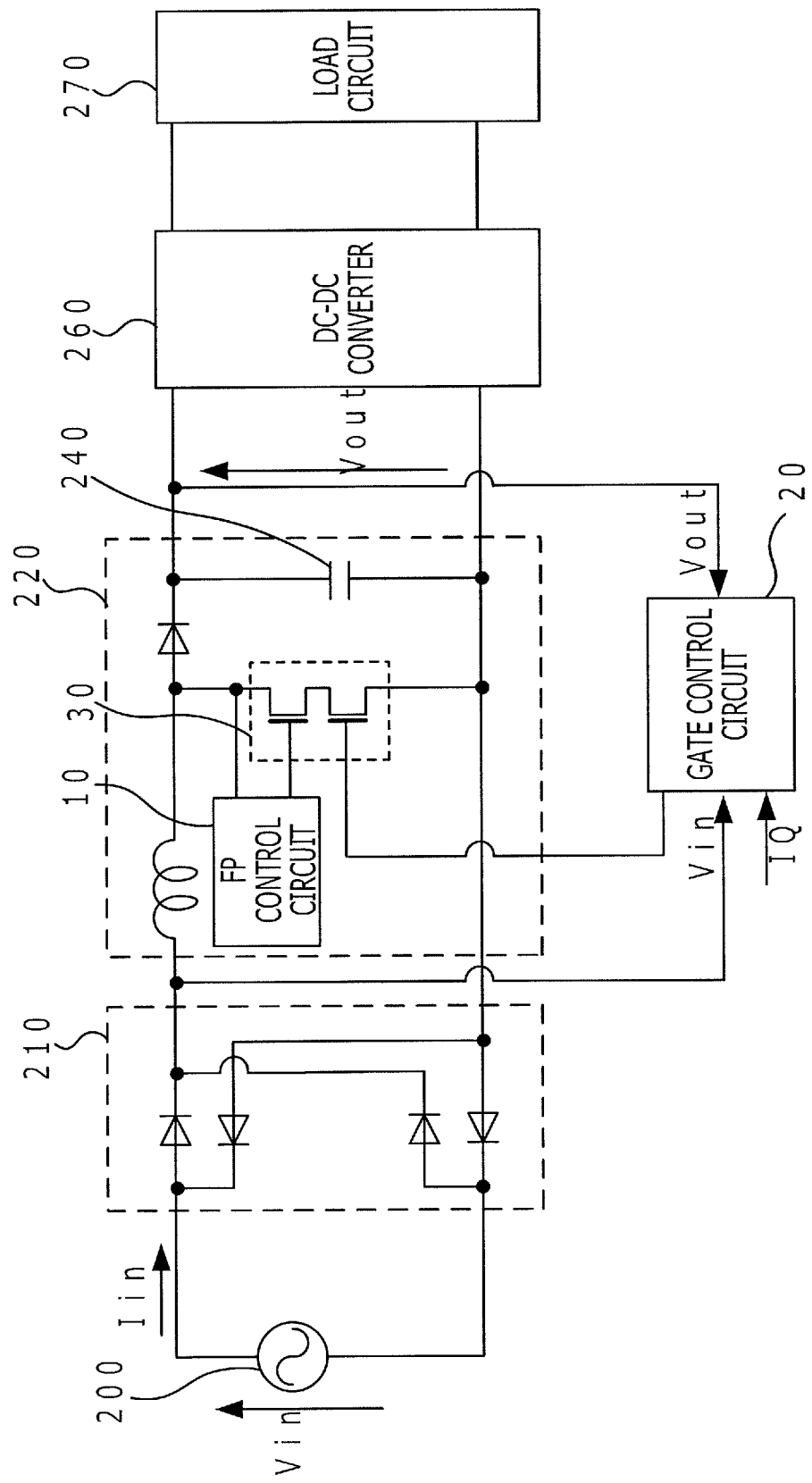
FIG. 6 is a diagram of a power supply device applying a control circuit according to an embodiment.

FIG. 6 is a circuit diagram of a power supply device using the field plate control circuit 10 and the gate control circuit 20 according to the present embodiment. The field plate control circuit 10 is provided inside a power factor correction (PFC) circuit 220 in order to improve the power factor of the power supply inside the power supply device. The power supply device illustrated in FIG. 6 includes a rectification circuit 210, a PFC circuit 220, a gate control circuit 20, and a direct current to direct current (DC-DC) converter 260.

The rectification circuit 210 is connected to an alternating current power supply 200, performs full-wave rectification on alternating current power, and outputs the result. Herein, since the output voltage of the alternating current power supply 200 is Vin, the input voltage of the rectification circuit 210 is Vin. The rectification circuit 210 outputs power that has been converted by performing full-wave rectification on alternating current power input from the alternating current power supply 200. Alternating power with a voltage from 80 V to 265 V is input into the rectification circuit 210, for example, and thus the output voltage from the rectification circuit 210 is also taken to be Vin.

The PFC circuit 220 is connected to a T-junction, and includes an inductor, the GaN-HEMT 30 as a switching element, a diode, and a smoothing capacitor 240. The PFC circuit 220 is an active filter circuit that reduces fluctuations in high-frequency waves or the like included in the current rectified by the rectification circuit 210, and improves the power factor of the power.

The gate control circuit 20 outputs a pulsed gate voltage to apply to the gate of the GaN-HEMT 30. The gate control circuit 20 determines a duty cycle for the gate voltage on the basis of the voltage value Vin of the power subjected to full-wave rectification and output from the rectification circuit 210, the current value of the current flowing through the GaN-HEMT 30, and the voltage value Vout on the output side of the smoothing capacitor 240, and applies the determined duty cycle to the gate of the GaN-HEMT 30. The circuit used as the gate control circuit 20 may be a multiplier circuit able to compute a duty cycle on the basis of the current value of the current flowing through the GaN-HEMT 30 and the voltage values Vout and Vin, for example.

The smoothing capacitor 240 smoothes the voltage output from the PFC circuit 220, and inputs the smoothed voltage into the DC-DC converter 260. A forward or full-bridge DC-DC converter may be used for the DC-DC converter 260, for example. Direct current power with a voltage of 385 V is input into the DC-DC converter 260, for example.

The DC-DC converter 260 is a conversion circuit that converts and outputs a voltage value of direct current power. A load circuit 270 is connected on the output side of the DC-DC converter 260.

Herein, the DC-DC converter 260 converts direct current power with a voltage of 385 V into direct current power with a voltage of 12 V, for example, and outputs the converted direct current power to the load circuit 270.

According to the present embodiment, it becomes possible to provide a power supply device with good efficiency due to being resilient against the effects of dynamic on-resistance, even in the case of using a high-frequency and high-voltage GaN-HEMT 30 inside the PFC circuit 220.

Although the foregoing describes an embodiment of the disclosed technology in detail, the disclosed technology is not limited to such a specific embodiment, and various alterations and modifications are possible within the scope of the principles of the disclosed technology as stated in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A transistor control circuit comprising:
   a transistor includes a gate electrode with a gate field plate,
      a drain electrode and a control electrode formed on top of an inter-layer insulating film between the gate field plate and the drain electrode;
   a comparator circuit compares a drain voltage of the transistor with reference voltages; and
   an electrode control circuit generates a voltage to impart to the control electrode on the basis of the comparison results from the comparator circuit.

2. The transistor control circuit according to claim 1, wherein
the electrode control circuit applies a first positive potential, and a second positive potential that is higher than the first potential, to the control electrode.

3. The transistor control circuit according to claim 1, wherein the drain voltage determination circuit includes
a voltage division circuit configured to divide the drain voltage,
a comparison voltage generation circuit configured to generate a plurality of comparison voltages, and
a comparison circuit configured to compare a drain voltage divided by the voltage division circuit against the plurality of comparison voltages.

4. The transistor control circuit according to claim 1, wherein
the transistor is realized by a compound semiconductor that includes nitrogen.

5. A power supply device comprising:
a DC-DC converter; and
a power supply circuit configured to supply power to the DC-DC converter, the power supply circuit including
a transistor includes a gate electrode with a gate field plate, a drain electrode and a control electrode formed on top of an inter-layer insulating film between the gate field plate and the drain electrode,
a comparator circuit compares a drain voltage of the transistor with reference voltages, and
an electrode control circuit generates a voltage to impart to the control electrode on the basis of the comparison results from the comparator circuit.

* * * * *